United States Patent

[11] 3,631,306

[72] Inventor Robert D. Hitchcock
Ventura, Calif.
[21] Appl. No. 810,267
[22] Filed Mar. 25, 1969
[45] Patented Dec. 28, 1971
[73] Assignee The United States of America as represented by the Secretary of the Navy

[54] SCHOTTKY-EMISSION THIN-FILM VARISTOR DIODE FORMED OF $Al/Al_2O_3/Mn/Mn_xO_y/Pb$ AND A METHOD OF FABRICATING THE DIODE

7 Claims, 2 Drawing Figs.

[52] U.S. Cl. .......... 317/234, 317/235, 117/212, 307/298
[51] Int. Cl. .......... H01l 9/00, H01l 9/10
[50] Field of Search .......... 317/238, 234 (8.1), 234 (8)

[56] References Cited

UNITED STATES PATENTS

| | | | |
|---|---|---|---|
| 3,372,315 | 3/1968 | Hartman | 317/235 |
| 3,500,145 | 3/1970 | Hitchcock | 317/238 |
| 3,258,608 | 6/1966 | Pollock | 307/88.5 |
| 3,275,905 | 9/1966 | Pollock | 317/234 |
| 3,321,711 | 5/1967 | Wolfe | 330/39 |
| 3,447,043 | 5/1969 | Wallace | 317/234 |

*Primary Examiner*—John W. Huckert
*Assistant Examiner*—Martin H. Edlow
*Attorneys*—R. I. Tompkins and Paul N. Critchlow

ABSTRACT: The diode is formed in a bell-jar system using a vapor-deposition technique to deposit a sandwich of thin-films on a glass substrate, the films including aluminum, aluminum oxide, manganese, manganese oxide and lead. Thus a five-layer diode system M/1/M/1/M is provided in which the 1/M/1 is a barrier member formed of the oxides and the manganese and having a thickness about 200 A. The electrodes are the aluminum and lead, i.e., the metals "M" which sandwich the barrier 1/M/1. Critically, the manganese oxide film is formed by a two-step process in which the deposited manganese film first is permitted to oxidize slowly, preferably, in the residual air of a reduced atmosphere of about $2–8\times10^{-5}$ torr. This oxidizing exposure, which may last for about 5 minutes, is followed by a relatively rapid oxidation of the manganese at atmosphere pressure.

INVENTOR.
ROBERT D. HITCHCOCK
BY
ATTORNEY

SCHOTTKY-EMISSION THIN-FILM VARISTOR DIODE FORMED OF $Al/Al_2O_3/MN/MN_xO_y/PB$ AND A METHOD OF FABRICATING THE DIODE

BACKGROUND OF THE INVENTION

1. Field of the invention

The invention relates to solid-state diodes and, in particular, to thin-film varistor-type diodes adapted for use in microelectronics.

2. Description of the Prior Art

In the continuing effort to minimize the cost and size of electronic components, a number of significant developments have been achieved, these developments including the semiconductor bulk solid diodes suitable for amplification and voltage regulation, such as the tunnel diode and the Zener diode. More recent developments have been concerned with thin-film components which, due to their relatively small size and weight, are better suited for the microelectronics of computer systems and the like. However, although thin-film capacitor and resistor components are in production stage, difficulty has been experienced in providing effective, reliable, low cost components to perform the more advanced functions of the bulk transistors and the diodes. Some advances, of course, have been achieved both in the field of thin-film superconducting diodes which may employ metallic alloys exhibiting superconductivity at temperatures of 0° to 18° K. and in the field of the thin-film metal/oxide/metal diodes which operate at room temperature. Again, however, as far as presently is known, the advances have involved principally demonstrations of desirable current-voltage (I-V) characteristics and have not been incorporated in production or prototype circuitry.

As has been indicated, the present invention principally is concerned with the metal/oxide/metal type of thin-film diode which operates at room or ambient temperature. To some extend these present advances represent an extension of earlier work performed by the inventor and reported in a Technical Report R–435 "Current-Voltage Characteristics of Thin-Film Diodes," produced by the U.S. Naval Civil Engineering Laboratory and available at the Clearinghouse (CFST). This report describes an investigation of the I-V characteristics of thin-film diodes and reports certain diodes, such as an $Al/Al_2O_3/Pb$-type, which exhibited the pronounced sharp knee of the Fowler-Nordheim I-V patterns, this knee, like the Zener knee, being the I-V characteristic which enables voltage regulation. However, these diodes seem to require DC excitation. At least, they could not be operated with AC voltage long enough to serve as a practical electronic device. Also, they failed to exhibit reproducible I-V characteristics in the nonsuperconducting state.

Another diode described in the Report is formed of aluminum, aluminum oxide, manganese and lead, this diode exhibiting reproducible symmetrical power law I-V characteristics and being capable of ambient temperature. Sixty Hertz excitation. Further, the I-V plot for this diode demonstrated a voltage regulating capability, and the symmetry of the plot also provided an important advantage in that it permits the use of a single component in contrast to the two back-to-back components required when the I-V plots are nonsymmetrical. In studying this diode it became apparent that the use of the manganese film between the aluminum oxide and the lead is a significant factor since experiments in which manganese simply was substituted for the lead of $Al/Al_2O_3/Pb$ diodes produced only straight line I-V plots. The principal difficulty, however, with this diode is in its long term stability or, in other words, its capability to retain its initial I-V plot without barrier or dielectric breakdown for lengthy periods of continuous operation, such as 100 hours or more. Obviously, long term stability is an essential requirement that must be satisfied if the component is to be employed in practical circuitry. Further, the diode did not achieve ideal voltage regulator I-V characteristics and improvements in this regard, as well as in the current-carrying capability were indicated.

SUMMARY OF THE INVENTION

It is therefore an object of the present invention to provide a thin-film diode of the metal/oxide/metal-type capable of exhibiting improved power law I-V characteristics at ambient temperatures under AC excitation.

A related object is to provide such a diode capable of reproducing maintaining its I-V characteristics over relatively long periods of continuous operation.

Another object is to provide a thin-film varistor diode having a symmetrical I-V characteristic in which a Schottky-type emission is the dominant current flow mechanism over a temperature range of 190° K. to about 350° K.

A further object is to provide a method of manufacturing such diodes which assures uniformly reliable results and the long term stability.

Other more general objects are to provide a miniturized, low-cost diode having improved voltage-regulating characteristics and also to provide an inexpensive, simple method of manufacturing which provides positive and accurate control over the characteristics of the end product.

These and other objects which will become apparent in the ensuing detailed description generally are achieved by producing a thin-film diode formed of aluminum, aluminum oxide, manganese, manganese oxide and lead. The diode is produced by a series of vapor deposit steps some of which, as will be described, are quite critical. In particular, it has been found that the structure of the manganese oxide is highly critical and that reliable, long term stability presently seems to be dependent upon the use of a two-step oxidation technique to provide this structure. The two steps include an initial slow oxidation of the manganese followed by a relatively rapid oxidation and, for reasons to be presented, it is believed that such a two-step technique results in the formation of a rather granular system of manganese, manganese oxide and residual gases.

DETAILED DESCRIPTION OF THE INVENTION

Figure 1:
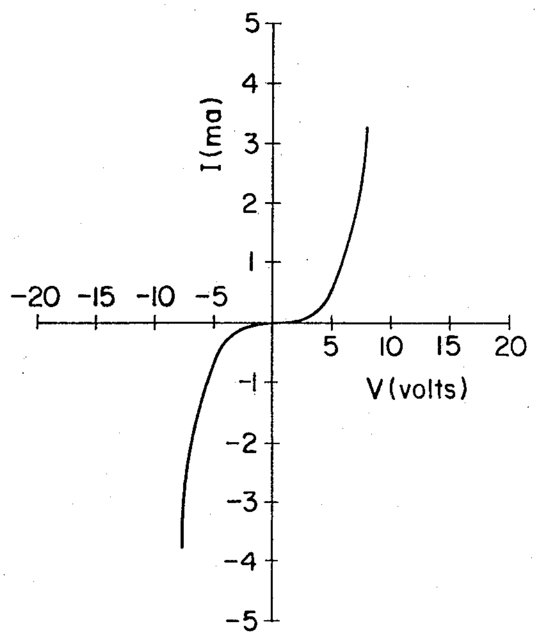
FIG. 1 is a plot illustrating the 60-Hertz I-V characteristic of the five-layer Schottky diode.

The diodes of the present invention are sandwich-type, laminated structures formed by vapor depositing a layer of aluminum on a substrate, permitting the aluminum to oxidize, depositing another layer of manganese, permitting oxidation of this layer and, finally, depositing a counter electrode of lead. With exceptions to be noted, the vapor deposition steps employ conventional procedures and commercially available bell jar, pressure or vacuum chamber equipment which is further described in the previously identified Technical Report and also in a copending patent application filed by the present inventor. The copending application is titled "Thin Vapor-Deposited Metal Film Voltage Regulator," further identified as Ser. No. 620,214, filed Mar. 1, 1967. Now U.S. Pat. No 3,500,145.

As stated, the diode sandwich is formed on a glass substrate which may be a rectangle cut from a microscope slide and having the dimensions 1×12×25 mm. Such substrates are common practice both in thin-film and in bulk solid-state components. Prior to the vapor deposition of the thin-films, the substrate should be thoroughly cleaned in ethyl alcohol, dried and then provided with connection terminals for external circuitry. As in the referenced Report and application, Indium-metal patches preferably are smeared onto the four edges of the substrate rectangle to provide solder connections for the external wire leads. These Indium patch terminals, in addition to accommodating the permanent external connections, also provide terminals for coupling a resistance measuring circuit across the manganese film both during the depositing of the film and during its subsequent oxidation. As already indicated, the manganese structure is highly critical and in a manner to be explained, it is achieved by measuring or monitoring the manganese resistance during the fabrication of the diode.

The substrate having been prepared in the described manner is mounted on a suitable support provided in the pressure or vacuum chamber of the bell-jar system and an aluminum film then deposited on it. The film is deposited in the form of a strip about 1 mm. wide extending about the full length of the substrate (25 mm.) from one of its indium end patches to the other. It is vacuum deposited by resistance heating of a tungsten helix previously charged with a 99.99 percent aluminum wire and preferably, the rate of evaporation of the aluminum is about 100 A./second. With the vacuum jar pressure between $10^{-5}$ and $10^{-4}$ torr, evaporation is continued until a film strip of about 2,000–3,000 A. is deposited. The substrate temperature is not controlled during the deposition.

The $Al_2O_3$ layer is formed by exposing the aluminum strip to atmospheric air for about 5 minutes, Preferably, the bell-jar pressure is brought to atmospheric and the aluminum permitted to oxidize while the substrate is being repositioned to permit the subsequent deposit of a manganese filmstrip at right angles to the aluminum strip. The final thickness of the aluminum oxide layer is estimated to be 10–40 A. and, in any event, it is unlikely according to present teachings that this thickness appreciably exceeds 50 A. As will become apparent in the subsequent theoretical discussion, the thickness of the aluminum oxide layer becomes a factor in promoting an understanding of the particular composition and structure of the combined barrier components, especially the manganese and manganese oxide components.

Deposition of the manganese again is in the form of a strip preferably extending, as stated, at right angles to the aluminum strip between and, of course, overlapping the indium patches formed on the sides of the substrate. The finished strip may be 3×10 mm. and it is highly transparent.

One of the significant features of the present diode is the control exercised during its fabrication over the evaporation and vacuum deposition of the manganese film, as well as the subsequent control over the oxidation of this film. In both of these fabrication steps, the control is exercised by constantly monitoring the manganese resistance as a function of time so that both the manganese deposition and its oxidation are achieved at predetermined rates. This resistance monitoring can be accomplished in a number of manners such as by using the indium patches to couple the manganese strip in series with a known resistance, a battery, and another known resistance. A strip chart recorder can be used to monitor the voltage of this circuit and, in practice, it was preferred to select values for the fixed resistance so that not more than 45 microamperes flowed through the manganese strip.

Prior to initiating the evaporation of the manganese, the bell jar is brought to a pressure of between $2–8\times10^{-5}$ torr, preferably about $8\times10^{-5}$. First, of course, the manganese source is supported in the jar. This source may be about 25 milligrams of manganese powder contained in a graphite crucible cut from a spectrographic rod to provide a member having a diameter of 6.3 mm., an inside length of 3.5 mm. and an outside depth of 7 mm. The crucible can be resistance heated by a tantalum basket coupled to an energy source to provide control over the current applied to the basket. Such regulated control, of course, is conventional practice in most deposition procedures.

The manganese first is preheated for a period of about 2 minutes with the heat supply low enough to prevent deposition onto the substrate which may be positioned about 4 mm. above the manganese source. Following preheating, the current is raised slowly until manganese begins to deposit as indicated by the chart recorder of the resistance-measuring circuit. Heating then is continued at a rate such that the manganese resistance decreases to approximately $3\times10^4$ ohms/square in 20 seconds at which point the heating immediately is terminated. During this 20-second period, it also may be advisable to monitor the temperature by attaching a thermocouple to the bare side of the substrate and by regulating the current so as to hold the temperature at or below 350° K. Although it has been found that the relatively slow buildup of the manganese film is a significant factor, it will be recognized that the resistance and heat measurements represent exemplary figures suited to the described conditions and that normal variations in these conditions might require some modification of the figures.

The formation of the manganese oxide film has been found to be the most critical step in the fabrication of the present diodes. In general, it appears essential to achieve an initial slow oxidation followed by a relatively rapid one, so as to, in effect, employ a two-step oxidation process. The slow step is accomplished by slowly oxidizing the deposited manganese film in the residual air of the bell jar which, as stated, is at a pressure of between $2–8\times10^{-5}$ torr, the pressure used to promote the deposition of the manganese film. The film is exposed to this residual air for a period of 4–5 minutes or until the manganese resistance, as determined by the chart recorder, has increased from the $3\times10^4$ ohms/square to about $5–9\times0^4$ ohms/square, preferably $7\times10^4$ ohms/square.

The rapid oxidation step then is accomplished by venting the chamber to allow the pressure to increase to atmospheric or about 760 torr, this increase causing the manganese resistance to increase to $3\times10^6$ ohms/square or greater. In practice, the resistance was found to rise rapidly with time so that a period of about 5 minutes at atmospheric pressure was sufficient.

The final step is the vacuum deposition of a 1×10 mm. lead strip counterelectrode on the manganese-manganese oxide strip, this lead strip thus being coextensive in length with the manganese although of substantially less width to assure against overlap onto the aluminum strip which lies beneath and at right angles to the manganese. Deposition of the lead is carried out at a pressure of $10^{-5}–10^{-4}$ torr by evaporation of a 99.99 percent lead pellet from a graphite crucible which also is resistance heated by a tantalum basket. To ensure electrical contact to the lead, counterelectrode indium patches are smeared over the ends of the lead strip with a soldering iron. Heating of the lead source may be continued until a film thickness of about 2,000 A. or greater is found.

The completed diode thus is a cruciform, sandwiched construction in which the length of the substrate mounts the aluminum and aluminum oxide films and the width of the substrate mounts the manganese, manganese oxide, lead films to provide a five-layer diode with, as has been established, Schottky characteristics enabling its use as a varistor. The two-step oxidation process appeared to be necessary for stable I-V curves having the shape shown in FIG. 1 indicative of the Schottky emission. Too rapid oxidation of the manganese, by venting immediately after deposition, was found to produce a thin-film diode with either ohmic behavior or nonSchottky traces which quickly changed to ohmic.

The Schottky-type emission is illustrated in FIG. 1 of the drawing which, more specifically, shows the 60-Hertz I-V characteristics of the five-layer diode recorded at about 300° K. As is apparent, the curve is symmetrical and it shows a rather sharp knee capable of regulating voltage in the same manners as the Zener or the Fowler-Nardheim knee. The knee is not as pronounced as the Zener but, as already pointed out, it has the distince advantage that, due to its symmetry, only one diode component is needed to regulate AC voltage rather than the back-to-back components needed for diodes with nonsymmetrical characteristics.

Figure 2:
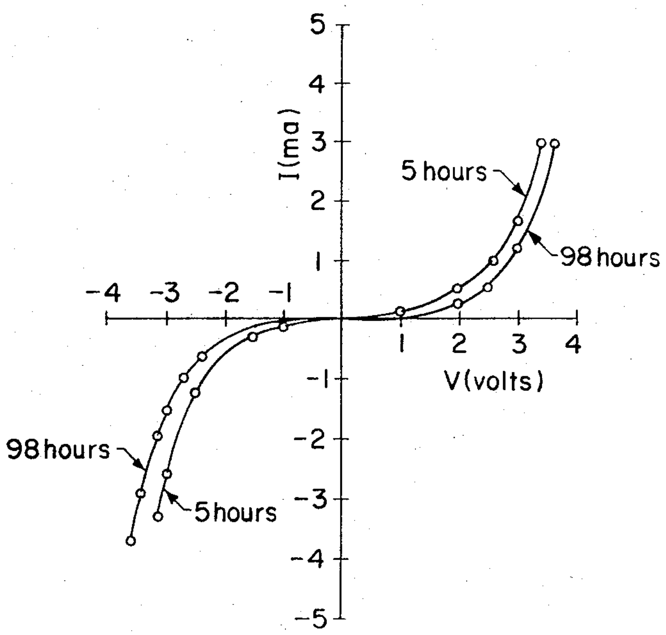
FIG. 2 is a plot similar to FIG. 1 illustrating the long term stability of the Schottky emission.

Another distinct advantage of the five-layer diode is its so-called long term stability illustrated in FIG. 2. As may be noted, the curves made at room temperature and atmospheric pressure compare the I-V characteristics of the diode at the beginning of the test with that recorded after a total operating time of 98 hours. The diode was without encapsulation of any kind. During a 24-hour period the peak-to-peak driving voltage was set at 7.6 volts after which there was no indication that the diode characteristic was about to straighten or display dielectric breakdown. A subsequent increase in the driving voltage to 8.4 volts, however, caused a breakdown in about 6 minutes. The significance of the curves shown in the drawing is the ability of the five-layer diode to maintain the symmetry of the I-V characteristic for a long period of continuous operation. As has been noted earlier, prior diodes, such as the $Al/Al_2O_3/Pb$-type, did not demonstrate this long term stability and, consequently, were not practical for use in circuits requiring long term operation. One operating advantage of the present diode therefore appears to be attributable in large part to the oxidation of the manganese.

The I-V characteristics, such as are shown in the drawing, were determined by a conventional four-wire current-source technique and were recorded by either a DC X-Y recorder or an oscilloscope with a Polaroid camera attachment.

Another type of measurement was used to establish the Schottky temperature dependence of the diode characteristics. This measurement used a special cold-finger system consisting of a copper plate attached to a copper cylinder immersible in one of three fluids, these being an ice bath, Dry Ice plus methyl alcohol, and liquid nitrogen. In making the measurements, the diode substrate was attached to the copper plate by a silicon grease with the film-side of the substrate facing up. Silicon grease also was used as protection of the junctions and the strips from destruction by condensation of water vapor. A copper-constantan thermocouple for measuring the diode temperature was embedded in the cold finger directly beneath its copper plate. Heat to the copper cold finger was supplied by a chromel wire wrapped around its cylinder and electrically insulated from it by glass tape.

Experiments were conducted with the five-layer diodes to determine as conclusively as possible the exact nature of the diode emission and also to determine the composition and structure of the barrier layers of the diode. Thus, a plot of $\ln I$ versus $V^{1/2}$ was constructed for the diode of FIG. 1 and the linearity of straight line nature of this plot proved to be consistent with the equation stating the theoretical I-V relation for Schottky emission. However, it was recognized that a straight line plot is not conclusive evidence of Schottky emission since temperature-independent current flow, such as that due to tunneling, can yield very nearly linear $\ln I - V^{1/2}$ plots. To establish temperature dependence other plots similar to the FIG. 1 plot were recorded for a temperature range of 285° to 344° K., the curves of these plots being distinct one from another at the different temperatures and the curves also having the same symmetry as that of FIG. 1 with about the same degree of bending. It further was found that other plots of $\ln - V^{1/2}$, $d\ln I/dV^{\text{one-half}} - 1/T$, and $\ln (1/T^2) - 1/T$ (where T is temperature in °K.) can be fitted by straight lines which show that Schottky emission is the dominant current-flow mechanism over a temperature range of 190° K. to about 350° K.

Barrier thickness of the $Al_2O_3/Mn/Mn_xO_y$ was investigated and mathematically determined to be approximately 200 A. The data for computing the thickness was obtained by high-frequency capacitance measurements made between the aluminum and lead films, the measurements using an RF reactance bridge with a standard signal generator and an RF voltmeter. The aluminum oxide layer was determined by other means to be no greater than about 50 A. This is an expected figure since it is known that 50 A. is close to the upper limit of tunneling thickness, and also since available prior art studies indicated that aluminum oxide produced in pure oxygen at room temperature and atmospheric pressure reaches of limiting thickness of 35 to 45 A. in a period of days. In air at 300° K. and 760 torr, a 10 A. layer of aluminum oxide forms in a period of a few seconds. Thus, the exposure of the $Al_2O_3$ of the present five-layer diode could be assumed to be between 10 A. and 45 A.

Assuming a 40 A. thickness for $Al_2O_3$ and a total barrier thickness of 200 A., it could be concluded that the barrier formed by the manganese and its oxide would be 160 A. Using this thickness of 160 A. yielded significant information on the nature of the deposited manganese and its oxide. Presumably the entire barrier of the five-layer diodes consists of the system $Al_2O_3/Mn/Mn_xO_y$ although most of the manganese may have oxidized. If pure manganese were initially deposited, the minimum value, of ohms/square, based upon the derived film thickness of 160 A., yields a value of $P_f$, the manganese-film resistivity, around $4.8 \times 10^{-2}$ ohm-cm. However, this value of $P_f$ is approximately $10^4$ times larger than the bulk resistivity of manganese, i.e., $P_o$, and it cannot be explained by the theory of thin-film resistivity in which $P_f$ varies inversely with thickness as a result of the boundary scattering of electrons. Since the pressure during manganese deposition was around $10^{-4}$ torr, it is more likely that not pure manganese, but rather a granular system of manganese ($Mn_xO_y$) and residual gases is deposited. The high value of $P_f$ then could be accounted for by the theory of thin-film resistivity based on the concept of agglomeration and the formation of potential walls throughout the film. The agglomeration theory predicts a relation in which $P_f/P_0 = \text{const} \exp(\text{const}/A_g)$ where $A_g$ equals the linear dimension of an average-sized metal granule. It is possible, theoretically, for $P_f/P_o$ to be about $10^4$ while, as stated, this value is impossible under the boundary-scattering theory. It thus is believed that the Mn and $Mn_xO_y$ barrier is a granular system of Mn interspersed in three dimensions in a matrix of $Mn_xO_y$, rather than a system in which the Mn is confined to a single stratum. In turn, it is believed that the long term stability of these diodes is the result of this unique structure of the barrier layer and this belief is supported by the finding that diodes in which the manganese was not slowly oxidized failed to demonstrate stability.

Based upon these findings, it is apparent that a five-layer diode of $Al/Al_2O_3/Mn/Mn_xO_y/Pb$, formed in accordance with the present teachings, demonstrates a symmetrical schottky emission that is reliable and reproducible, as well as one that possesses long term stability and, with nominal refinement, can lead to a varistor thin-film diode that is inexpensive and of practical utility.

Obviously many modifications and variations of the present invention are possible in the light of the above teachings. It is therefore to be understood that within the scope of the appended claims the invention may be practiced otherwise than as specifically described.

I claim:

1. A vapor-deposition method of manufacturing a thin-film Schottky-emission diode comprising the steps of:

disposing a substrate in a vapor-deposition pressure chamber, reducing chamber pressure and applying heat to an aluminum source for depositing an aluminum film on the substrate, exposing said deposited aluminum film to air for forming an aluminum oxide film of about 10–50 A. thickness, again reducing chamber pressure to about $2-8 \times 10^{-5}$ torr and applying a controllably limited amount of heat to a manganese source for slowly vapor depositing a manganese film on said aluminum oxide, terminating said heat and exposing said deposited manganese for a determinable period of time in the residual air of said reduced $2-8 \times 10^{-5}$ torr atmosphere for slowly oxidizing the manganese to form manganese oxide film, determining said manganese exposure period by monitoring the ohmic resistance of said manganese and maintaining the exposure until said resistance increases to about $5-9 \times 10^4$ ohms/square, exposing said deposited and slowly oxidized manganese to a vented atmosphere for promoting a relatively rapid oxidation, and again applying heat in a reduced pressure chamber atmosphere to a source of counterelectrode for depositing a counterelectrode film on said oxidized manganese.

2. The method of claim 1 wherein said limited amount of heat is applied to said manganese source for a period of no less then about 20 seconds and the heat applied does not exceed about 350° K. when measured at the filmless surface of the substrate.

3. The method of claim 1 wherein said limited heat applied to said manganese source is controlled by monitoring the heat-responsive decrease in manganese resistance to attain a gradual decrease to about $3\times10^4$ ohms/square in no less than about 20 seconds.

4. The method of claim 1 wherein said slow oxidation of the manganese is maintained for about 5 minutes.

5. The method of claim 1 wherein said counterelectrode is lead and wherein the thickness of the aluminum and lead films are about 2,000–3,000 A.

6. A vapor-deposited thin-film varistor diode having Schottky-emission I-V characteristics comprising:

a substrate, an aluminum base electrode film deposited on said substrate, an aluminum oxide film of about 10–50 A. thickness formed on said aluminum film, a manganese film formed on said oxide, a manganese oxide film formed on said manganese film, and a counterelectrode film formed on said manganese oxide, said manganese and manganese oxide films providing a barrier system having a combined film thickness of about 150–190 A. and said system having a film resistivity about $10^4$ times larger than the bulk resistivity of manganese, said manganese oxide film being a type resulting from a two-step vapor-deposition process in which the first step is a slow oxidation in a reduced atmospheric pressure of about $2-8\times10^{-5}$ torr for a period of about 5 minutes and the second step is a relatively rapid oxidation.

7. The diode of claim 6 wherein said counterelectrode is lead and the aluminum and lead both are about 2,000–3,000 A. in thickness.

* * * * *